US006358669B1

(12) United States Patent
Savariar-Hauck et al.

(10) Patent No.: US 6,358,669 B1
(45) Date of Patent: Mar. 19, 2002

(54) THERMAL DIGITAL LITHOGRAPHIC PRINTING PLATE

(75) Inventors: Celin Savariar-Hauck, Badenhausen (DE); Ken-ichi Shimazu, Briarcliff Manor, NY (US); Hans-Joachim Timpe, Osterode (DE); Jayanti Patel, Woodcliff Lake; Jianbing Huang, Woodridge, both of NJ (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/469,489

(22) Filed: Dec. 22, 1999

Related U.S. Application Data

(63) Continuation-in-part of application No. 09/301,866, filed on Apr. 29, 1999.
(60) Provisional application No. 60/090,300, filed on Jun. 23, 1998.

(51) Int. Cl.$^7$ .................................................. G03F 7/09
(52) U.S. Cl. ..................................... 430/273.1; 430/302
(58) Field of Search ................................ 430/141, 155, 430/164, 165, 271.1, 273.1, 281.1, 283.1, 302; 101/453, 467, 465

(56) References Cited

U.S. PATENT DOCUMENTS

| | | | | | |
|---|---|---|---|---|---|
| 3,645,733 | A | | 2/1972 | Brinckman et al. | 430/325 |
| 4,687,727 | A | | 8/1987 | Toyama et al. | 430/175 |
| 5,112,743 | A | | 5/1992 | Kamiya et al. | 430/175 |
| 5,141,838 | A | | 8/1992 | Aoshima et al. | 430/191 |
| 5,493,971 | A | | 2/1996 | Lewis et al. | 101/454 |
| 5,529,891 | A | * | 6/1996 | Wang et al. | 430/523 |
| 5,536,619 | A | * | 7/1996 | Verburgh | 430/273.1 |
| 5,609,993 | A | | 3/1997 | Hase et al. | 430/302 |
| 5,641,608 | A | | 6/1997 | Grunwald et al. | 430/302 |
| 5,705,308 | A | | 1/1998 | West et al. | 430/165 |
| 5,705,322 | A | | 1/1998 | West et al. | 430/325 |
| 5,731,127 | A | | 3/1998 | Ishizuka et al. | 430/270.1 |
| 5,858,604 | A | * | 1/1999 | Takeda et al. | 430/162 |
| 5,919,600 | A | * | 7/1999 | Huang et al. | 430/272.1 |
| 6,004,728 | A | * | 12/1999 | Deroover et al. | 430/302 |
| 6,022,667 | A | * | 2/2000 | Vermeersch et al. | 430/271.1 |
| 6,060,217 | A | * | 5/2000 | Nguyen et al. | 430/302 |
| 6,060,222 | A | * | 5/2000 | West et al. | 430/326 |
| 6,066,434 | A | * | 5/2000 | Blanchet-Fincher et al. | 430/273.1 |
| 6,074,802 | A | * | 6/2000 | Murata et al. | 430/270.1 |
| 6,083,662 | A | * | 7/2000 | Miller et al. | 430/302 |
| 6,083,663 | A | * | 7/2000 | Vermeersch et al. | 430/302 |
| 6,090,532 | A | * | 7/2000 | West et al. | 430/326 |
| 6,096,481 | A | * | 8/2000 | Vermeersch et al. | 430/302 |
| 6,153,353 | A | * | 11/2000 | Van Damme et al. | 430/270.1 |
| 6,182,570 | B1 | * | 2/2001 | Rorke et al. | 101/462 |
| 6,186,067 | B1 | * | 2/2001 | Rorke et al. | 101/467 |
| 6,192,798 | B1 | * | 2/2001 | Rorke et al. | 101/457 |
| 6,200,727 | B1 | * | 3/2001 | Urano et al. | 430/270.1 |
| 6,251,559 | B1 | * | 6/2001 | Huang et al. | 430/270.1 |
| 6,280,899 | B1 | * | 8/2001 | Parsons et al. | 430/270.1 |
| 6,294,311 | B1 | * | 9/2001 | Shimazu et al. | 430/271.1 |

FOREIGN PATENT DOCUMENTS

| | | | |
|---|---|---|---|
| DE | 2626769 | | 1/1977 |
| DE | 4231324 | | 1/1993 |
| EP | 0368327 | | 5/1990 |
| EP | 0 678 380 | A2 | 10/1995 |
| EP | 0784233 | | 7/1997 |
| EP | 0823327 | | 2/1998 |
| EP | 0864419 | | 9/1998 |
| EP | 0864420 | | 9/1998 |
| EP | 0908779 | | 4/1999 |
| EP | 0909657 | | 4/1999 |
| EP | 919868 | A1 * | 6/1999 |
| GB | 1245924 | | 9/1971 |
| JP | 09034110 | | 7/1995 |
| WO | 9707986 | | 3/1997 |
| WO | 9739894 | | 10/1997 |

* cited by examiner

*Primary Examiner*—Janet Baxter
*Assistant Examiner*—Barbara Gilmore
(74) *Attorney, Agent, or Firm*—Ratner & Prestia

(57) ABSTRACT

A thermally imageable element, useful as a lithographic printing plate precursor is disclosed. The element comprises a hydrophilic substrate; an underlayer comprising a first polymeric material; and an ink-receptive top layer comprising a second polymeric material. Preferably, the top layer comprises a compound that functions as a solubility-suppressing component. The solubility-suppressing component may be a separate dissolution inhibitor compound and/or the second polymeric material may also function as a solubility-suppressing component. On thermal exposure the exposed regions of the top layer becomes more readily soluble in an aqueous developer, allowing the developer to remove the top layer and reveal the surface of the hydrophilic substrate. The lithographic printing plate thus formed has excellent properties, including the absence of sludging of the developer.

37 Claims, No Drawings

THERMAL DIGITAL LITHOGRAPHIC PRINTING PLATE

CROSS REFERENCE TO RELATED APPLICATIONS

This application is a continuation-in-part of U.S. application Ser. No. 09/301,866, incorporated herein by reference, filed Apr. 29, 1999, which claims priority from U.S. Provisional Application Serial No. 60/090,300, filed Jun. 23, 1998.

FIELD OF THE INVENTION

The invention relates to multilayer thermally imageable elements useful in lithographic printing. More particularly, this invention relates to lithographic printing plates that can be thermally imaged by imagewise exposure with a laser or a thermal printing head.

BACKGROUND OF THE INVENTION

The art of lithographic printing is based on the immiscibility of oil and water. Ink receptive areas are generated on the surface of a hydrophilic surface. When the surface is moistened with water and then ink is applied, the hydrophilic background areas retain the water and repel the ink and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plates typically comprise a radiation-sensitive coating applied over the hydrophilic surface of a support. If after exposure to radiation, the exposed regions of the coating become soluble and are removed in the developing process, revealing the underlying hydrophilic surface of the support, the plate is called as a positive-working printing plate. Conversely, if exposed regions of the plate become insoluble in the developer and the unexposed regions are removed by the developing process, the plate is called a negative-working plate. In each instance, the regions of the radiation-sensitive layer (i.e., the image areas) that remain are ink-receptive and the regions of the hydrophilic surface revealed by developing process accept water, a typically fountain solution, and repel ink.

Direct digital imaging of offset printing plates, which obviates the need for exposure through a negative, is becoming increasingly important in the printing industry. Heat-sensitive imaging elements for the preparation of positive-working lithographic printing plates have been disclosed comprising a substrate, an aqueous alkali soluble underlayer, and an infrared sensitive top layer. On infrared exposure, the exposed regions of the top layer become soluble or permeable in aqueous alkali so that the developer can penetrate the top layer and remove the underlayer, revealing the underlying substrate. Imaging can be carried out with an infrared laser.

Thermally imageable systems have also been developed in which it is believed that a thermally frangible complex is formed between a polymeric material and a solubility-suppressing component, which reversibly suppresses the solubility of the polymeric material in the developer. The solubility-suppressing component can be a separate dissolution inhibitor compound and/or the polymeric material can act as a solubility-suppressing component. After imagewise thermal exposure, the rate of dissolution of the exposed regions is greater that the rate of dissolution of the unexposed regions. The exposed regions may be removed by the developer to form an image. Such systems are disclosed in, for example, Parsons, WO 97/39894, and U.S. application Ser. No. 08/981,620; Nagasaka, EP 0 823 327; Miyake, EP 0 909 627; West, WO 98/42507 and U.S. application Ser. No. 08/821,844; and Nguyen, WO 99/11458, and U.S. application Ser. No. 08/922,190, all of which are incorporated herein by reference.

These systems have limited shelf life and can only be used with a restricted group of developers. They have only a narrow working latitude compared to conventional positive-working printing plates. These systems also have limited resistance to aggressive blanket washes, such as a UV wash.

Systems have been produced in which a developer-insoluble top layer is coated over a developer-soluble underlayer. After exposure the top layer becomes permeable to developer, which penetrates the top layer and dissolves the underlayer, revealing the hydrophilic substrate. However, the developer insoluble material in the top layer, which is removed when the underlayer is removed, causes sludging in the developer. Insoluble particles, which can adhere to the imaged and developed printing plate and adversely affect the quality of the printed image, are produced. The processor must be modified so that the insoluble particles are not circulated in the developer. Thus, a need exists for an improved thermally imageable element, useful as a lithographic printing member, that does not suffer from these disadvantages.

SUMMARY OF THE INVENTION

The invention is a multilayer thermally imageable element, useful as a precursor for a lithographic printing member. The element comprises, in order:

a) a substrate, the substrate having a hydrophilic surface;

b) an underlayer over the hydrophilic surface, the underlayer comprising a first polymeric material; and c) a top layer over the underlayer, the top layer comprising a second polymeric material; in which:

the top layer is ink receptive;

the top layer is insoluble in aqueous alkaline developer;

the underlayer comprises a photothermal conversion material;

the underlayer is soluble in aqueous alkaline developer; and the second polymeric material is soluble in aqueous alkaline developer.

The second polymeric material is soluble in aqueous alkaline developer, but the top layer is insoluble in aqueous alkaline developer. However, the top layer becomes soluble in aqueous alkaline developer following thermal exposure.

In a preferred embodiment, the top layer comprises a solubility-suppressing component and the second polymeric material contains phenolic hydroxyl groups. The solubility-suppressing component may be a dissolution inhibitor compound and/or the second polymeric material may act as the solubility-suppressing component. Novolac resins functionalized with sulfonate ester groups are preferred polymeric materials that function as solubility-suppressing components. Quinonediazides (i.e., compounds that contain the o-diazonaphthoquinone moiety) are preferred dissolution inhibitor compounds.

In another preferred embodiment, the underlayer comprises an absorber than absorbs radiation in the range of the imaging wavelength, typically about 800 nm to 1200 nm.

In another embodiment, the invention is an exposed and developed element, which can be used as a lithographic printing member. In another embodiment, the invention is a process for forming the lithographic printing member. In still another embodiment, the invention is a method of printing using the lithographic printing member.

DETAILED DESCRIPTION OF THE INVENTION

The thermally imageable element (sometimes referred to as a printing plate precursor) comprises a hydrophilic substrate, typically comprising an aluminum or polyester support; a radiation absorbing underlayer comprising a first polymeric material; and an ink-receptive top layer comprising a second polymeric material. Although other layers, such as radiation absorbing layers may be present, typically no other layers are present.

The top layer preferably comprises a compound that functions as a solubility-suppressing component. The solubility-suppressing component may be a separate dissolution inhibitor compound and/or the second polymeric material may also function as a solubility-suppressing component. However, the top layer becomes more readily soluble in aqueous alkaline developer after the element has been exposed to radiation, allowing the developer to remove the top layer and reveal the hydrophilic surface of the substrate in the exposed regions. The lithographic printing member thus formed has excellent properties, including the absence of sludging of the developer.

Hydrophilic Substrate

The hydrophilic substrate, i.e., the substrate that comprises at least one hydrophilic surface, comprises a support, which may be any material conventionally used to prepare lithographic printing plates. The support is preferably strong, stable and flexible. It should resist dimensional change under conditions of use so that color records will register in a full-color image. Typically, it can be any self-supporting material, including polymeric films, ceramics, metals, or stiff papers, or a lamination of any of these materials. Paper supports are typically "saturated" with polymerics to impart water resistance, dimensional stability and strength.

Metal supports include aluminum, zinc, titanium, and alloys thereof. A preferred metal support is an aluminum sheet. The surface of the aluminum sheet may be treated by techniques known in the art, including physical graining, electrochemical graining, chemical graining, and anodizing, and then conditioned by chemical means, for example by treatment with water, a solution of phosphate or silicate salt, or a polycarboxylic acid to produce the hydrophilic surface.

If the surface is roughened, the average roughness Ra is preferably in the range 0.1 $\mu$m to 0.8 $\mu$m. Roughened substrates in which the surface has a surface roughness of 0.1 $\mu$m to 2 $\mu$m are disclosed in Bhambra, WO97/19819 (PCT/GB96/02883); Bhambra, WO98/52769 (PCT/GB98/01500); and Bhambra, WO98/52768 (PCT/GB/98/01496). In these substrates the support is coated with a hydrophilic layer that comprises a mixture of two particulate materials, preferably alumina and titanium dioxide. The mean particle size of the alumina particles is preferably in the range of 1 $\mu$m to 5 $\mu$m; the mean particle size of the titanium dioxide particles is preferably in the range of 0.1 $\mu$m to 0.5 $\mu$m.

Useful polymeric films include polyester films (such as Mylar® polyethylene terephthalate film sold by E.I. du Pont de Nemours Co., Wilmington, Del., and polyethylene naphthanate). A preferred polymeric film is polyethylene terephthalate.

The substrate may consist only of the support, or it may additionally comprise one or more optional subbing and/or adhesion layers. Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, aminopropyltriethoxysilane, glycidoxypropyltriethoxysilane and epoxy functional polymers, as well as conventional subbing materials used on polyester bases in photographic films.

The back side of the substrate (i.e., the side opposite the underlayer and top layer) may be coated with an antistatic agent and/or a slipping layer or matte layer to improve handling and "feel" of the imageable element.

The support should be of sufficient thickness to sustain the wear from printing and be thin enough to wrap around a printing form. Polyethylene terephthalate or polyethylene naphthanate, typically has a thickness of from about 100 to about 310 $\mu$m, preferably about 175 $\mu$m. Aluminum sheet typically has a thickness of from about 100 to about 600 $\mu$m.

Underlayer

The underlayer, or first layer, is over the hydrophilic surface of the hydrophilic substrate. After imaging, it is removed by the aqueous alkaline developer to expose the underlying hydrophilic surface of the substrate. It is preferably soluble in the aqueous alkaline developer to prevent sludging of the developer. Preferably it is soluble in a wholly aqueous developer, i.e. one that does not include added organic solvents.

The underlayer comprises a first polymeric material. The first polymeric material is soluble in an aqueous alkaline developer. In addition, the first polymeric material should be insoluble in the solvent used to coat the top layer so that the top layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Particularly useful polymeric materials are copolymers that comprise N-substituted maleimides, especially N-phenyl-maleimide; methacrylamides, especially methacylamide; and acrylic and/or methacrylic acid, especially methacrylic acid. More preferably two functional groups are present in the polymeric material, and most preferably all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some of all of the methacrylamide. Other aqueous alkaline soluble monomers, such as acrylic acid, may be used in place of some or all of the methacrylic acid.

These polymeric materials are soluble aqueous alkaline developers. In addition they are soluble in methyl lactate/ methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the first polymeric material are aqueous alkaline developer soluble copolymers that comprise a monomer that has a urea bond in its side chain (i.e., a pendent urea group), such are disclosed in Ishizuka, U.S. Pat. No. 5,731,127, incorporated herein by reference. These copolymers comprise about 10 to 80 wt %, preferably about 20 to 80 wt %, of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

R is preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$[CH_2{=}C\ (CH_3){-}CO_2{-}CH_2CH_2{-}NH{-}CO{-}NH\text{-}p\text{-}C_6H_4{-}Z],$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acryl-amides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in aqueous alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)-methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838, incorporated herein by reference. Particularly useful polymeric materials comprise (1) the sulfonamide monomer unit, especially N-(p-aminosulfonylphenyl) methacrylamide; (2) acrylonitrile and/or methacrylonitrile; and (3) methyl methacrylate and/or methyl acrylate. Certain of these copolymers are available as the "PU Copolymers" from Kokusan Chemical, Gumma, Japan. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the first polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; meth-acrylamides, especially methacylamide; and acrylic and/or methacrylic acid, especially methacrylic acid (2) with an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl)-methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxy-ethanol/20 wt % water, based on the total weight the first and second polymeric materials in the underlayer. The first and second polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

The underlayer absorbs radiation, preferably radiation in the range of about 800 nm to 1200 nm, the range of radiation commonly used for imaging thermally imageable elements. An absorber, sometimes referred to as "a photothermal conversion material" is present in the underlayer. Photothermal conversion materials absorb radiation and convert it to heat. Photothermal conversion materials may absorb ultraviolet, visible, and/or infrared radiation and convert it to heat. Although the first polymeric material may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrrilium or metal diothioline class. Examples of absorbing pigments are Projet 900, Projet 860 and Projet 830 (all available from the Zeneca Corporation). Carbon black pigments may also be used. Because of their wide absorption bands, carbon black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be chosen, for example, from indoaniline dyes, oxonol dyes, porphyrin derivatives, anthraquinone dyes, merostyryl dyes, pyrylium compounds and sqarylium derivatives. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618, all of which are incorporated herein by reference. Examples of useful absorbing dyes include, ADS-830A and ADS-1064 (both available from American Dye Source, Montreal, Canada), EC2117 (available from FEW, Wolfen, Germany), Cyasorb IR 99 and Cyasorb IR 165 (both available from Glendale Protective Technology), Epolite IV-62B and Epolite III-178 (both available from the Epoline), PINA-780 (available from the Allied Signal Corporation), SpectraIR 830A and SpectraIR 840A (both available from Spectra Colors).

The amount of imaging radiation absorber in the underlayer is generally sufficient to provide an optical density of at least 0.05, and preferably, an optical density of from about 0.5 to about 2 at the imaging wavelength. As is well known to those skilled in the art, the amount of absorber required to produce a particular optical density can be determined from the thickness of the underlayer and the extinction coefficient of the absorber at the wavelength used for imaging using Beers law. Typically the underlayer comprises at least about 0.1 wt % of imaging radiation absorber, and preferably from about 1 to about 30 wt % of absorber.

Top Layer

The top layer, or second layer, comprises a second polymeric material, which is ink-receptive and dissolves in an aqueous alkaline developer. However, the top layer is insoluble in aqueous alkaline developer prior to imaging, but becomes soluble in aqueous alkaline developer following imaging. Second polymeric materials that are water insoluble, but dissolve in an aqueous alkaline developer, are used to prevent sludging of the developer.

Although the top layer may absorb radiation in the range of 600 nm to 1200 nm, especially in the range of 800 nm to 1200 nm, preferably the top layer does not substantially absorb radiation in the range of 600 nm to 1200 nm, especially in the range of 800 nm to 1200 nm. If absorption of radiation in this wavelength range by the top layer is desired, an absorber, i.e. photothermal conversion material, such as is described above, may be added to the top layer. Absorber may be added to both the top layer and the underlayer, to the top layer only, or to the underlayer only. Preferably, the absorber is added to the underlayer only. Preferably, the underlayer absorbs imaging radiation, i.e., infrared radiation and radiation in the range of 600 nm to 1200 nm, especially in the range of 800 nm to 1200 nm, and the top layer does not substantially absorb imaging radiation, i.e., infrared radiation and radiation in the range of 600 nm to 1200 nm, especially in the range of 800 nm to 1200 nm.

Polymers that contain phenolic hydroxyl groups, i.e., phenolic resins, are preferred. Preferably the polymeric material is a light-stable, water-insoluble, aqueous alkaline developer-soluble, film-forming polymeric material that has a multiplicity of phenolic hydroxyl groups, either on the polymer backbone or on pendant groups. Phenolic groups impart aqueous alkaline developer solubility to the top layer and are also believed to form a thermally frangible complex with the solubility-suppressing component. Novolac resins, resol resins, acrylic resins that contain pendent phenol groups, and polyvinyl phenol resins are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other useful phenolic resins include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

The top layer preferably comprises a compound that functions as a solubility-suppressing component for the second polymeric material. While not being bound by any theory or explanation, it is believed that solubility-suppressing components are "reversible insolubilizers," i.e., compounds that reversibly suppress the solubility of the second polymeric material in the aqueous alkaline developer. Solubility-suppressing components have polar functional groups that are believed to act as acceptor sites for hydrogen bonding with the hydroxyl groups present in the second polymeric material. The acceptor sites comprise atoms with high electron density, preferably selected from electronegative first row elements, especially carbon, nitrogen, and oxygen. Solubility-suppressing components that are soluble in the aqueous alkaline developer are preferred.

The solubility-suppressing component may be a separate dissolution inhibitor compound. Alternatively, or additionally, the polymeric material may contain polar groups in addition to phenolic groups and, thus, function as both the polymeric material and the solubility-suppressing component. Useful dissolution inhibitor compounds are disclosed in West, U.S. Pat. No. 5,705,308; Bennett, WO97/07986 [PCT/GB96/01973], Nagasaka, EP 0,823,327, and U.S. patent application Ser. No. 08/752,698, filed Feb. 21, 1997, allowed Apr. 12, 1999, all of which are incorporated herein by reference.

Solubility-suppressing components are believed to reversibly reduce the rate at which the second polymeric material dissolves in an aqueous alkaline developer. In general, such compounds should have an "inhibition factor" of at least 0.5, and preferably at least 5. Inhibition factors for given compounds can be readily measured using the procedure described by Shih et al, *Macromolecules*, 27, 3330 (1994). The inhibition factor is the slope of the line obtained by plotting the log of the development rate as a function of inhibitor concentration in the coating. Development rates are conveniently measured by laser interferometry, as described by Meyerhofer, *IEEE Trans. Electron Devices*, ED-27, 921 (1980).

Useful polar groups include, for example, diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as solubility-suppressing components. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as solubility-suppressing components. Compounds that contain aromatic groups, such as phenyl, substituted phenyl such as p-methylphenyl, and naphthyl, are especially useful.

Compounds that contain a diazo group that are useful as dissolution inhibitor compounds include, for example, o-diazonaphthoquinones (i.e., quinonediazides), such as compounds in which the o-diazonaphthoquinone moiety is attached to a ballasting moiety that has a molecular weight of less than about 5000. Typically these compounds are prepared by the reaction of a 1,2-naphthoquinone diazide having a halogenosulfonyl group, typically a sulfonylchloride group, at the 4- or 5-position with a mono- or poly-hydroxyphenyl compound, such as a mono- or poly-hydroxy benzophenone. Preferred reactive compounds are the sulfonyl chloride or esters; the sulfonyl chlorides are most preferred. These compounds are discussed, for example, in Chapter 5 of *Photoreactive Polymers: the Science and Technology of Resists*, A. Reiser, Wiley, N.Y., 1989, pp. 178–225.

Compounds that contain a diazo group that are useful as dissolution inhibitor compounds include, for example, compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000. Typically these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone. Preferred reactive compounds are the sulfonyl chloride or esters; the sulfonyl chlorides are most preferred. These compounds are discussed, for example, in Chapter 5 of *Photoreactive Polymers: the Science and Technology of Resists*, A. Reiser, Wiley, N.Y., 1989, pp. 178–225.

Useful compounds include, but are not limited to: 2,4-bis(2-diazo-1,2-dihydro-1-oxo-5-naphthalenesulfonyloxy)benzo-phenone; 2-di-azo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalene-sulfonic acid; 2,2'-bis(2-diazo-1,2-dihydro-1-oxo-5-naphthalenesulfonyloxy)biphenyl; 2,2', 4,4'-tetrakis(2-diazo-1,2-dihydro-1-oxo-5-naphthalenesulfonyloxy)biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalene-sulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2', 4,4'-tetrakis(2-diazo-1,2-dihydro-1-oxo-4-naphthalenesulfonyloxy)

biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816.

The phenolic resin may be derivitized with a o-diazonaphthoquinone moiety. Polymeric diazonaphthoquinone compounds include derivitized resins formed by the reaction of a reactive derivative that contains diazonaphthoquinone moiety and a polymeric material that contains a suitable reactive group, such as a hydroxyl or amino group. Suitable polymeric materials for forming these derivitized resins include the novolac resins, resole resins, polyvinyl phenols, acrylate and methacrylate copolymers of hydroxy-containing monomers such as vinyl phenol and 2-hydroxyethyl methacrylate, polyvinyl alcohol, etc. Representative reactive derivatives include sulfonic and carboxylic acid, ester or amide derivatives of the diazonaphthoquinone moiety. Derivitization of phenolic resins with compounds that contain the diazonaphthoquinone moiety is well known in the art and is described, for example, in West, U.S. Pat. Nos. 5,705,308, and 5,705,322. An example of a resin derivitized with a compound that comprises a diazonaphthoquinone moiety is P-3000, a naphthoquinone diazide of a pyrogallol/acetone resin (available from PCAS, France). These derivitized polymeric materials can act as both the second polymeric material and a solubility-suppressing component. They can be used alone in the top layer, or they can be combined with other polymeric materials and/or solubility-suppressing components.

Compounds that contain a positively charged (i.e., quaternized) nitrogen atom useful as dissolution inhibitor compounds include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide; tetraethyl ammonium bromide; tetrapropyl ammonium chloride; and trimethylalky ammonium chlorides and trimethylalky ammonium bromides, such as trimethyloctyl ammonium bromide and trimethyldecyl ammonium chloride. Representative triarylmethane dyes dissolution inhibitor compounds include ethyl violet, crystal violet, malachite green, brilliant green, Victoria blue B, Victoria blue R, and Victoria pure blue BO.

Quaternized heterocyclic compounds are useful as dissolution inhibitors. Representative imidazoline compounds include Monazoline C, Monazoline O, Monazoline CY, and Monazoline T, all of which are manufactured by Mona Industries. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzo-thiazolium cationic dyes and 3-ethyl-2-methyl benzothiazolium iodide. Suitable pyridinium dissolution inhibitor compounds include cetyl pyridinium bromide and ethyl viologen dications.

Diazonium salts are useful as dissolution inhibitor compounds and include, for example, substituted and unsubstituted diphenylamine diazonium salts, such as methoxy-substituted diphenylamine diazonium hexafluoroborates. These compounds are particularly useful in non-preheat plates.

Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenyl amine and triphenyl amine.

Keto containing compounds useful as dissolution inhibitor compounds include, for example, aldehydes; ketones, especially aromatic ketones; and carboxylic acid esters. Representative aromatic ketones include xanthone, flavanone, flavone, 2,3-diphenyl-1-indenone, 1'-(2'-acetonaphthonyl)benzoate, α- and β-naphthoflavone, 2,6-diphenyl-4H-pyran-4-one and 2,6-diphenyl-4H-thiopyran-4-one. Representative carboxylic acid esters include ethyl benzoate, n-heptyl benzoate, phenyl benzoate.

A preferred group of dissolution inhibitor compounds are those that are also dyes, especially triarylmethane dyes such as ethyl violet. These compounds can also act as contrast dyes, which distinguishes the unimaged regions from the imaged regions in the developed imageable element.

When a dissolution inhibitor compound is present in the top layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the second polymeric material can comprise polar groups that act as acceptor sites for hydrogen bonding with the hydroxy groups present in the polymeric material and, thus, act as a solubility-suppressing component. Using methods well know to those skilled in the art, a portion of the polymeric material hydroxyl groups can be derivitized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

Derivitization of the hydroxyl groups of the polymeric material increases its molecular weight and reduces the number of hydroxyl groups, typically reducing both the solubility and the rate of dissolution of the polymeric material in the developer. Although is important that the level of derivitization be high enough that the polymeric material acts as a solubility-suppressing component, it should not be so high that, following thermal imaging, the polymeric material is not soluble in the developer. Although the degree of derivitization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivitized. These derivitized polymeric materials can act as both the second polymeric material and a solubility-suppressing component. They can be used alone in the top layer, or they can be combined with other polymeric materials and/or solubility-suppressing components.

One preferred group of polymeric materials that comprise polar groups and function as solubility-suppressing components are derivitized phenolic polymeric materials in which a portion of the phenolic hydroxyl groups have been converted to sulfonic acid esters, preferably phenyl sulfonates or p-toluene sulfonates. Derivitization can be carried by reaction of the polymeric material with, for example, a sulfonyl chloride such as p-toluene sulfonyl chloride in the presence of a base such as a tertiary amine. A preferred polymeric material is a derivitized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

It will be appreciated by those skilled in the art that although phenolic polymers which have been derivitized with polar groups [e.g., polymers in which some of the hydroxyl groups have been derivitized with sulfonic acid ester groups or with groups that contain the diazonaphthoquinone moiety] are soluble in aqueous alkaline developer, a layer comprising or consisting essentially of one or more of these materials is "insoluble" in aqueous alkaline developer. This is because solubility and insolubility are determined by the relative rates at which the imaged and unimaged regions of the layer dissolve in the developer. Following imagewise thermal exposure of a layer comprising or consisting essentially of one or more of these derivitized phenolic polymeric materials, the exposed regions of the layer dissolve in the aqueous alkaline developer more rapidly than the unexposed regions. If development step is carried out for an appropriate time, the exposed regions are removed and the unexposed regions remain, so that an image made up of the unexposed regions is formed. Hence the exposed regions are "soluble" in the aqueous developer and the unexposed regions are "insoluble" in the aqueous alkaline developer.

The solubility-suppressing components are believed not to be sensitive, i.e. photoreactive, themselves to radiation in the range of about 600 nm to about 800 nm and radiation in the range of about 800 nm to about 1200 nm, the range typically used for imaging a thermally imageable element. If radiation is to be used for imaging and it is to be absorbed in the underlayer (i.e., the underlayer comprises an imaging radiation absorber), the solubility-suppressing component preferably should not absorb a significant amount of the imaging radiation. The imaging radiation should pass through the top layer so that it can be absorbed by the absorber in the underlying underlayer. Thus, unless absorption of imaging radiation by the top layer is desired, when a dye is used as the solubility-suppressing component, it should not absorb a significantly at the imaging wavelength if the element is to imaged by radiation and the radiation is to be absorbed in the underlayer. Preferably, the imaging radiation absorber absorbs more strongly in the range of about 800 nm to about 1200 nm than it does in the visible (i.e., about 380 nm to about 780 nm).

The top layer may also comprise dye to aid in the visual inspection of the exposed and/or developed element. Printout dyes to distinguish the exposed regions from the unexposed regions during processing. Contrast dyes distinguish the unimaged regions from the imaged regions in the developed plate.

Preparation of the Thermally Imageable Element

The thermally imageable element may be prepared by sequentially applying the underlayer over the hydrophilic surface of the hydrophilic substrate, and then applying the top layer over the underlayer using conventional coating or lamination methods. However, it is important to avoid intermixing the underlayer and top layer.

The underlayer, or first layer, may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The top layer, or second layer, may be applied over the underlayer, typically to the surface of the underlayer by any conventional method, such as those listed above. The term "solvent" includes mixtures of solvents, especially mixtures of organic solvents.

Selection of the solvents used to coat the underlayer and to coat the top layer will depend on the nature of the first polymeric material, the second polymeric material, and the other ingredients present in the layers. To prevent the underlayer from dissolving and mixing with the top layer when the top layer is coated over the underlayer, the top layer should be coated from a solvent in which the first polymeric material is essentially insoluble. Thus, the coating solvent for the top layer should be a solvent in which the second polymeric material is sufficiently soluble that the top layer can be formed and in which the first polymeric material is essentially insoluble. Although the solvents used depend on the nature of the polymeric materials, typically the first polymeric material will be soluble in more polar solvents and insoluble in less polar solvents so that the solvent used to coat the underlayer is more polar than the solvent used to coat the top layer. Consequently, the top layer can typically be coated from a conventional organic solvent such as toluene or 2-butanone. An intermediate drying step, i.e., drying the underlayer to remove coating solvent before coating the top layer over it, may also be used to help prevent mixing of the layers.

The top layer may be coated as an aqueous dispersion to avoid dissolving the underlayer during the coating process. Alternatively, the underlayer, the top layer or both layers may be applied by conventional extrusion coating methods from a melt mixture of layer components. Typically, such a melt mixture contains no volatile organic solvents.

Imaging

Imaging of the imageable element produces an imaged element, which comprise a latent image of imaged and unimaged regions. Developing the exposed element to form a developed element converts the latent image to an image by removing the exposed regions of the top layer and the underlayer, and exposing the hydrophilic surface of the underlying substrate. The element is positive working, in that the underlayer and top layers are removed in the exposed regions. The exposed regions become the non-ink accepting regions.

While not being bound by any theory or explanation, it is believed that a thermally frangible complex is formed between the solubility-suppressing component and the polymeric material. When the element is heated, typically be imagewise thermal exposure, the thermally frangible complex breaks down. The developer penetrates the exposed regions of the top layer much more rapidly than it penetrates the unexposed regions. The underlying regions of the underlayer are removed along with the exposed regions of the top layer, revealing the underlying hydrophilic surface of the substrate.

The thermally imageable element may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a Creo Trendsetter (available from the CREO Corp., British Columbia, Canada) and a Gerber Crescent 42T (available from the Gerber Corporation).

Alternatively, the thermally imageable element may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the element absorb infrared radiation. However, elements that absorb infrared radiation can be imaged with a thermal head.

In either case, the image signals are stored as a bitmap data file on a computer. Such files may be generated by a raster image processor (RIP) or other suitable means. For example, a RIP can accept input data in page-description language, which defines all of the features required to be transferred onto the imageable element, or as a combination of page-description language and one or more image data files. The bitmaps are constructed to define the hue of the color as well as screen frequencies and angles.

The developer may be any liquid or solution that can penetrate and dissolve both the exposed regions of the top layer and the underlying regions of the underlayer without substantially affecting the complimentary unexposed regions. While not being bound by any theory or explanation, it is believed that image discrimination in these systems is based on a kinetic effect. The exposed regions of the top layer dissolve more rapidly in the basic developer than the unexposed regions. Development is carried for a long enough time to dissolve the exposed regions of the top layer and the underlying regions of the underlayer in the developer, but not long enough to dissolve the unexposed regions of the top layer. Hence the exposed regions are described as being "soluble" in the developer because they dissolve more rapidly in the developer than the unexposed regions. However, it will be appreciated that, if the exposed element is developed for a long enough time, both the exposed and the unexposed regions will be dissolved.

Useful developers are aqueous solutions having a pH of about 7 or above. Preferred aqueous alkaline developers are those that have a pH between about 8 and about 13.5, typically at least about 11, preferably at least about 12. Wholly aqueous developers, i.e., those that do not comprise an added organic solvent, are preferred. Useful developers include commercially available developers, such as PC3000, PC955, and PC9000, aqueous alkaline developers each available from Kodak Polychrome Graphics LLC.

Typically the developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced.

The developed element, typically a lithographic printing plate or printing member, comprises (1) regions in which the underlayer and top layer have been removed revealing the underlying surface of the hydrophilic substrate, and (2) complimentary regions in which the underlayer and top layer have not been removed. The regions in which both the underlayer and top layer have not been removed are ink receptive and correspond to the regions that were not exposed during imaging.

If desired, a post-development baking step can be used to increase the run length of the plate. Baking can be carried out, for example, at about 220° C. to about 240° C. for about 7 to 10 minutes.

The advantageous properties of the invention can be observed by reference to the following examples that illustrate, but do not limit, the invention.

EXAMPLES

| Glossary | |
|---|---|
| ADS-830A | Infrared absorbing dye ($\lambda_{max}$ = 830 nm) (American Dye Source, Montreal, Canada) |
| Copolymer 1 | Copolymer of N-phenylmaleimide, methacrylamide, and methacrylic acid (50:35:15 mol %) |
| Copolymer 2 | Copolymer of N-phenylmaleimide, methacrylamide, and methacrylic acid (45:35:20 mol %) |
| Copolymer 3 | Copolymer of N-phenylmaleimide, methacrylamide, and methacrylic acid (40:35:20 mol %) |
| DOWANOL ® PM | Propylene glycol methyl ether |
| EC2117 | Infrared absorbing dye ($\lambda_{max}$ = 830 nm) (FEW, Wolfen, Germany) |
| Ethyl Violet | C.I. 42600; CAS 2390-59-2 ($\lambda_{max}$ = 596 nm) $[(p-(CH_3CH_2)_2NC_6H_4)_3C^+Cl^-]$ |
| GANTREZ ® AN119 | Linear methyl vinyl ether/maleic anhydride copolymer; specific viscosity of 0.1 to 0.5 (1% in 2-butanone at 25° C.); molecular weight of 190,000 (ISP, New Jersey, USA) |
| LB744 | Cresol novolac resin (Bakelite, Iserlohn-Letmathe, Germany) |
| PMP234 | Copolymer (40:50:10 wt %) of APK-234, acrylonitrile, and methacrylamide. APK-234 is a urea substituted monomer of the following structure: $[CH_2{=}C(CH_3){-}CO_2{-}CH_2CH_2{-}NH{-}CO{-}NH\text{-}p\text{-}C_6H_4{-}OH]$ |
| PU Copolymer | Copolymer of N-(p-aminosulfonylphenyl)-methacrylamide, acrylonitrile, and methyl methacrylate (34/24/42 mol % = 60.5/9.3/30.2 wt %) |

-continued

| Glossary | |
|---|---|
| Triazine B | 2,4-Bis(trichloromethyl)-6-(4-methoxy-1-naphthyl)-1,3,5-triazine (PCAS, France) |

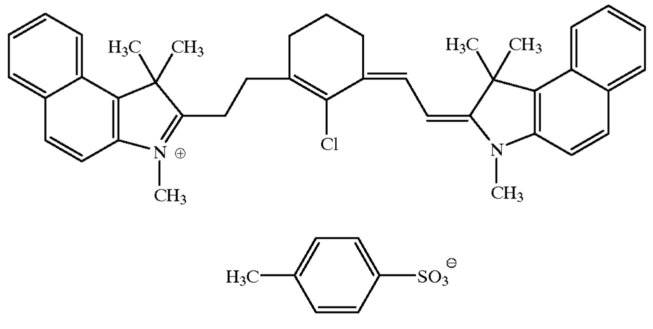

EC2117

Example 1

This example describes the preparation of a tosylated novolac resin tosylated to 1.8 mol %. Dry novolac resin (120 g) is dissolved by stirring in acetone (325 g) in a 600 mL beaker and the solution cooled to about 10° C. p-Toluene sulfonyl chloride (3.56 g) is added over a period of about 1 min. Triethyl amine (2.09 g) is added at about 10° C. over a period of about 1 hr and the reaction mixture stirred at ≦15° C. for 1 hr. Acetic acid (1.36 g) is added at about 10° C. over about 1 min and the reaction mixture stirred for about 15 min.

A mixture of 3.0 Kg of ice and 3.0 Kg of water is placed in a 7.5 L breaker. Acetic acid (5 g) is added with stirring and the mixture stirred at about 15° C. for about 1 min. About 25% of the reaction mixture is added and the mixture stirred for about 20 min. The reaction mixture is allowed to settle for about 20 min and the supernatant decanted from the precipitate.

Water (about 1.9 Kg) is added to the precipitate and the resulting mixture stirred for 5 min at about 15° C. The precipitate is allowed to settle for 20 min and the supernatant decanted. The process is repeated with the remaining three portions of the reaction mixture. The precipitate is collected and dried to yield about 123 g of tosylated novolac resin in which about 1.8 mol % of the hydroxyl groups have been converted to tosyl groups.

By this procedure a novolac resin tosylated to 1.8 mol % is prepared from a m-cresol/formaldehyde novolac resin obtained from Schenectady International, Schenectady, N.Y., USA.

Example 2

Following the procedure of Example 1, a novolac resin tosylated to 1.8 mol % is prepared from a cresol/formaldehyde novolac resin (75:25 m-cresol/p-cresol) obtained from Borden Chemical, Columbus, Ohio, USA.

Example 3

This example describes the preparation of Copolymer 2. Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

If the polymerization is carried out in 1,3-dioxolane, in some cases reprecipitation can be avoided. The monomers are soluble 1,3-dioxolane, but the polymeric material is insoluble and precipitates during the reaction.

Example 4

Following the procedure of Example 3, methacrylic acid (27.1 g), N-phenylmaleimide (183.7 g), and methacrylamide (62.5 g) were reacted with AIBN (3.4 g) to form Copolymer 1.

Example 5

This example describes the preparation of Copolymer 3. Following the procedure of Example 3, methacrylic acid (55.74 g), N-phenylmaleimide (181.48 g), methacrylamide (77.13 g) were heated with AIBN (0.425 g) at 60° C. with stirring for about 24 hr. Then about 5 L of methanol was added, and the precipitated copolymer filtered, washed twice with methanol, and dried in the oven at 40° C. for 2 days.

Example 6

This example illustrates the preparation of N-(p-phenylsulfonamide)-substituted (methyl vinyl ether/maleimide) copolymer, a polymeric material that incorporates an N-substituted cyclic imide moiety. A 20 wt % solution of GANTREZ® AN119 was prepared using anhydrous N-methyl-pyrrolidone (NMP). A sample of the solution (156 g) was placed in a beaker and dissolved in anhydrous NMP (300 g). Once dissolved, p-aminobenzenesulfonamide (34.46 g) was added and dissolved by stirring. Then, dimethylaminopyridine (0.2 g) was dissolved in the solution. After stirring for 45 minutes at ambient temperature, the solution was heated to 90–95° C. by immersion in a hot water bath for 1 hr. The mixture was allowed to cool and left to stand overnight.

A 3 L beaker containing 2 L of distilled water containing 10 mL of concentrated hydrochloric acid was stirred. The reaction mixture was very slowly poured into the stirring water as a thin stream causing the desired product to precipitate as a tan-pink suspension. The mixture was stirred for 2 hr and then allowed to settle. The mixture was filtered and re-suspended in a further 2 L of water for 2 hr before filtering and drying in a fan oven overnight to form dark brown granules (48.4 g; 78.0% yield).

FTIR Analysis shows the presence of the imide C—N—C stretch showing that a cyclic imide is present in the produce. A very weak peak also shows the presence of N—H groups of an amide group suggesting the presence of a hydrolyzed or non-ring closed product present in a trace amount.

Other copolymers that incorporate an N-substituted cyclic imide moiety may be prepared by this general procedure. For example, p-aminophenol can be reacted with GANTREZ® AN119 copolymer to prepare a copolymer that incorporates an N-substituted cyclic imide moiety.

Example 7

Copolymer 1 (4.8 g) and EC2117 (0.2 g) were dissolved in 45 g of methyl lactate/methanol/dioxolane (15:42.5:42.5 wt %) mixture and coated onto a substrate to give a coating weight of 1.83 g/m$^2$. The substrate was an aluminum sheet that had been electrochemically grained, anodized, and coated with polyvinyl phosphonic acid. LB744 (4.85 g) and ethyl violet (0.15 g) were dissolved in 60 mL of a mixture of DOWANOL® PM glycol ether and acetone (70:30 wt %) and coated on top of the previous layer at a coating weight of 1.25 g/m$^2$. The thermally imageable element thus formed was dried at 92° C. for 90 min.

The thermally imageable element was imaged with a laser diode emitting at 810 nm mounted on a rotating drum to form limes and solids regions. The imaged element was developed in GOLDSTAR™ DC developer (Kodak Polychrome Graphics LLC) to from a lithographic printing plate. The image areas had good resistance to the developer. The plate showed good developibility in the imaged areas, giving a clean background and lines.

The plate has a soak loss of 44% when given a blanket wash in diacetone alcohol/water (80:20 wt %) and 38% in ethylene glycol monomethyl ether. For comparison, the Fuji FPU plate has soak losses of 85% and 14% in these washes, respectively.

A plate was prepared by this procedure was treated with Kodak Polychrome Graphics 243 Deletion Fluid. The image was removed in about 0.5 min. A similar plate was baked at 230° C. for 8 min and then treated with the deletion fluid. The image was not removed after 8 min.

Example 8

Copolymer 2 (4.8 g) and EC2117 (0.2 g) were dissolved in 45 g of methyl lactate/methanol/dioxolane (15:42.5:42.5 wt %) mixture and coated onto the substrate described in Example 7 to give a coating weight of 1.62 g/m$^2$. The tosylated novolac produced in Example 1 (2.45 g) and ethyl violet (0.05 g) were dissolved in 25 mL of a mixture of DOWANOL® PM glycol ether and acetone (70:30 wt %) and coated on top of the previous layer at a coating weight of 1.12 g/m$^2$. The thermally imageable element thus formed was dried at 92° C. for 90 min.

The thermally imageable element was imaged as described in Example 7 to form lines and solids regions. The imaged element was developed in GOLDSTAR™ DC developer to form a printing plate. A good image with a clean background was obtained. After baking as described in Example 7, the image was not removed by deletion fluid after 8 min.

Example 9

Copolymer 2 (4.8 g) and EC2117 (0.2 g) were dissolved in 45 g of methyl lactate/methanol/dioxolane (15:42.5:42.5 wt %) mixture and coated onto the substrate described in Example 6 to give a coating weight of 1.62 g/m$^2$. The tosylated novolac produced in Example 2 (2.45 g) and ethyl violet (0.05 g) were dissolved in 25 mL of a mixture of DOWANOL® PM glycol ether and acetone (70:30 wt %) and coated on top of the previous layer at a coating weight of 0.99 g/m$^2$. The thermally imageable element thus formed was dried at 92° C. for 90 min.

The element was imaged as described in Example 7 to form lines and solids regions. The imaged element was developed in the GOLDSTAR™ DC developer to form a printing plate. A good image with a clean background was obtained. After baking as described in Example 7, the image was not removed by deletion fluid after 8 min.

Example 10

PMP234 (2.4 g), EC2117 (0.1 g), and ethyl violet (0.05 g) were dissolved in 25 g of ethylene glycol monomethyl ether and coated onto the substrate described in Example 7 to give a coating weight of 1.90 g/m$^2$. The tosylated novolac produced in Example 2 (4.85 g), tetrapropyl ammonium bromide (0.2 g) and ethyl violet (0.10 g) were dissolved in 70 mL of 2-butanone and coated on top of the previous layer at a coating weight of 0.8 g/m$^2$. The thermally imageable element thus formed was dried at 92° C. for 90 min.

The element was imaged as described in Example 7 to form lines and solids regions. The imaged element was developed in the PC 2000M developer (Kodak Polychrome Graphics). The imaged regions had good resistance to the developer. A good image with a clean background was obtained. The coating soak loss was 30% in a blanket wash of diacetone alcohol. After baking as described in Example 7, the image was not removed by deletion fluid after 8 min.

Example 11

This example illustrates the use of a mixture of polymeric materials in the underlayer. Copolymer 3 (3.75 g), PU copolymer (1.25 g), and ADS-830A (0.9 g) were dissolved in a 100 g of a methanol/dioxolane/methyl lactate mixture (43:43:14 wt %). The resulting coating solution was spin coated onto the lithographic substrate at a coating weight of 1.5 g/m$^2$ to produce a coated substrate.

Solvent resistance of the underlayer was measured in terms of soak loss in two different solvent mixtures. The soak loss was measured by measuring the weight change of a 1 dm$^2$ plate before soaking at room temperature and after soaking for a specific time and drying. Soak loss was calculated by dividing the weight loss by the total weight of the coating.

The one-minute soak loss for the underlayer in the 80 wt % diacetone alcohol/20 wt % mixture was 32%. The one-minute soak loss in the 80% 2-butoxyethanol/20% water was 1%.

LB744 (4.85 g) and ethyl violet (0.15 g) were dissolved in a mixture of 20 g of 2-methoxypropanol and 40 g of toluene to produce a coating solution that was spin coated over the coated substrate at a coating weight of 1.2 g/m$^2$ to produce a thermally imageable element. The thermally imageable element was imagewise exposed on the Creo Trendsetter at a power setting of 8.5 W and a drum speed of 120 rpm. The imaged element was developed by wiping a soft pad soaked with developer 956. A good image was obtained.

Having described the invention, we now claim the following and their equivalents.

What is claimed is:

1. A thermally imageable element comprising, in order:

a) a substrate, the substrate having a hydrophilic surface;

b) an underlayer over the hydrophilic surface, the underlayer comprising a first polymeric material; and c) a top layer over the underlayer, the top layer comprising a second polymeric material;

in which:

the top layer is ink receptive;

the top layer is insoluble in aqueous alkaline developer;

the underlayer comprises a photothermal conversion material;

the underlayer is soluble in aqueous alkaline developer;

the second polymeric material is soluble in aqueous alkaline developer; and the second polymeric material contains phenolic hydroxyl groups.

2. The thermally imageable element of claim 1 in which the second polymeric material is soluble in at least one organic solvent in which the first polymeric material is insoluble.

3. The thermally imageable element of claim 1 in which the top layer comprises at least one solubility-suppressing component.

4. The thermally imageable element of claim 3 in which the photothermal conversion material is an absorber that is soluble in the aqueous alkaline developer.

5. The thermally imageable element of claim 4 in which the first polymeric material contains at least one functional group selected from the group consisting of carboxylic acid, N-substituted cyclic imide, and amide.

6. The thermally imageable element of claim 5 in which the first polymeric material is a copolymer that contains carboxylic acid, N-substituted cyclic imide, and amide functional groups.

7. The thermally imageable element of claim 6 in which the first polymeric material comprises about 25 to about 75 mol % of N-phenylmaleimide; about 10 to about 50 mol % of meth-acrylamide; and about 5 to about 30 mol % of methacrylic acid.

8. The thermally imageable element of claim 7 in which the first polymeric material comprises about 35 to about 60 mol % of N-phenylmaleimide; about 15 to about 40 mol % of meth acrylamide; and about 10 to about 30 mol % of methacrylic acid.

9. The thermally imageable element of claim 4 in which first polymeric material is a copolymer that contains a pendent urea group.

10. The thermally imageable element of claim 9 in which the first polymeric material comprises about 20 to 80 wt % of one of more monomers represented by the general formula:

$$[CH_2{=}C\,(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

11. The thermally imageable element of claim 10 in which R is $CH_3$; X is —$(CH_2CH_2)$—; Y is unsubstituted 1,4-phenylene; and Z is —OH.

12. The thermally imageable element of claim 4 in which the first polymeric material is a copolymer that contains a pendent sulfonamide group.

13. The thermally imageable element of claim 12 in which the first polymeric material contains about 10 to 90 mol % of a sulfonamide monomer unit; acrylonitrile or methacrylonitrile; and methyl methacrylate or methyl acrylate.

14. The thermally imageable element of claim 3 in which the underlayer absorbs radiation in the range of about 800 nm to about 1200 nm and the top layer does not absorb significantly in the range of about 800 nm to about 120 nm.

15. The thermally imageable element of claim 14 in which the photothermal conversion material is an absorber that is soluble in the aqueous alkaline developer.

16. The thermally imageable of claim 14 in which the second polymeric material comprises a novolac resin functionalized with polar groups.

17. The thermally imageable element of claim 14 in which the solubility-suppressing component is a dissolution inhibitor compound.

18. The thermally imageable element of claim 17 in which the dissolution inhibitor compound is a selected from the group consisting of compounds that contain the o-diazonaphthoquinone moiety, ammonium compounds, triarylmethane dyes, and sulfonate esters.

19. The thermally imageable element of claim 18 in which the second polymeric material is a novolac resin, a novolac resin functionalized with polar groups, or a mixture thereof.

20. The thermally imageable element of claim 1 in which the photothermal conversion material is an absorber that is soluble in the aqueous alkaline developer.

21. The thermally imageable element of claim 1 in which the underlayer absorbs radiation in the range of about 800 nm to about 1200 nm and the top layer does not absorb significantly in the range of 800 nm to about 1200 nm.

22. The thermally imageable element of claim 1 in which the top layer comprises at least one solubility-suppressing component, and the underlayer absorbs radiation the range of about 800 nm to about 1200 nm.

23. The thermally imageable element of claim 22 in which the underlayer comprises an absorber that is soluble in the aqueous alkaline developer.

24. The thermally imageable element of claim 23 in which the first polymeric material contains at least one functional group selected from the group consisting of carboxylic acid, N-substituted cyclic imide, and amide.

25. The thermally imageable element of claim 24 in which the first polymeric material is a copolymer that contains carboxylic acid, N-substituted cyclic imide, and amide functional groups.

26. The thermally imageable element of claim 25 in which the first polymeric material comprises about 25 to about 75 mol % of N-phenylmaleimide; about 10 to about 50 mol % of meth acrylamide; and about 5 to about 30 mol % of methacrylic acid.

27. The thermally imageable element of claim 26 in which the first polymeric material comprises about 35 to about 60 mol % of N-phenylmaleimide; about 15 to about 40 mol % of methacrylamide; and about 10 to about 30 mol % of methacrylic acid.

28. The thermally imageable element of claim 23 in which first polymeric material is a copolymer that contains a pendent urea group.

29. The thermally imageable element of claim 28 in which the first polymeric material comprises about 20 to 80 wt % of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

30. The thermally imageable element of claim 29 in which R is $CH_3$; X is —($CH_2CH_2$)—; Y is unsubstituted 1,4-phenylene; and Z is —OH.

31. The thermally imageable element of claim 23 in which the first polymeric material is a copolymer that contains a pendent sulfonamide group.

32. The thermally imageable element of claim 31 in which the first polymeric material contains about 10 to 90 mol % of a sulfonamide monomer unit; acrylonitrile or methacrylonitrile; and methyl methacrylate or methyl acrylate.

33. A method for forming an image, the method comprising:

(1) imaging an imageable element to form an imaged element, the imageable element comprising:

a) a substrate, the substrate having a hydrophilic surface;

b) an underlayer over the hydrophilic surface, the underlayer comprising a first polymeric material; and c) a top layer over the underlayer, the top layer comprising a second polymeric material;

in which:

the top layer is ink receptive;

the top layer is insoluble in aqueous alkaline developer;

the underlayer comprises a photothermal conversion material;

the underlayer is soluble in aqueous alkaline developer;

the second polymeric material is soluble in aqueous alkaline developer; and the second polymeric material contains phenolic hydroxyl groups; and (2) developing the imaged element with an aqueous alkaline developer to form an imaged and developed element, the imaged and developed element comprising an image.

34. The method of claim 33 in which the top layer comprises at least one solubility-suppressing component, the underlayer absorbs radiation the range of about 800 nm to about 1200 nm, and the thermal conversion material is soluble in aqueous alkaline developer.

35. The method of claim 33 in which the second polymeric material is a novolac resin, a novolac resin functionalized with polar groups, or a mixture thereof.

36. An imaged and developed element, the element made by the method comprising:

(1) imaging an imageable element to form an imaged element, the imageable element comprising:

a) a substrate, the substrate having a hydrophilic surface;

b) an underlayer over the hydrophilic surface, the underlayer comprising a first polymeric material; and c) a top layer over the underlayer, the top layer comprising a second polymeric material;

in which:

the top layer is ink receptive;

the top layer is insoluble in aqueous alkaline developer;

the underlayer comprises a photothermal conversion material;

the underlayer is soluble in aqueous alkaline developer;

the second polymeric material is soluble in aqueous alkaline developer;

the second polymeric material contains phenolic hydroxyl groups; and the top layer is ink receptive (2) developing the imaged element with an aqueous alkaline developer to form an imaged and developed element, the imaged and developed element comprising an image.

37. The method of claim 36 in which the top layer comprises at least one solubility-suppressing component, the underlayer absorbs radiation the range of about 800 nm to about 1200 nm, and the thermal conversion material is soluble in aqueous alkaline developer.

* * * * *

UNITED STATES PATENT AND TRADEMARK OFFICE

CERTIFICATE OF CORRECTION

PATENT NO. : 6,358,669 B1 
DATED : March 19, 2002
INVENTOR(S) : Savariar-Hauck et al.

It is certified that error appears in the above-identified patent and that said Letters Patent is hereby corrected as shown below:

Column 21,
Line 41, delete "meth-acrylamide" and insert therefore -- methacrylamide --;
Line 46, delete "meth acrylamide" and insert therefore -- methacrylamide --.

Column 22,
Line 6, delete "120 nm" and insert therefore -- 1200 nm --;
Line 19, delete "o-diazonaphthoquinone" and insert therefore -- *o*-diazonaphthoquinone --;
Line 47, delete "meth acrylamide" and insert therefore -- methacrylamide --.

Signed and Sealed this

Third Day of September, 2002

Attest:

JAMES E. ROGAN

*Attesting Officer* *Director of the United States Patent and Trademark Office*